(12) United States Patent
Levy et al.

(10) Patent No.: US 8,871,570 B2
(45) Date of Patent: Oct. 28, 2014

(54) METHOD OF FABRICATING INTEGRATED OPTOELECTRONIC INTERCONNECTS WITH SIDE MOUNTED TRANSDUCER

(75) Inventors: Shmuel Levy, Kyriat Tivon (IL); Shai Rephaeli, Kyriat Tivon (IL)

(73) Assignee: Mellanox Technologies Ltd., Yokneam (IL)

( * ) Notice: Subject to any disclaimer, the term of this patent is extended or adjusted under 35 U.S.C. 154(b) by 392 days.

(21) Appl. No.: 13/419,447

(22) Filed: Mar. 14, 2012

(65) Prior Publication Data

US 2013/0241050 A1    Sep. 19, 2013

(51) Int. Cl.
*H01L 21/00* (2006.01)
*H01L 23/34* (2006.01)
*H01L 21/78* (2006.01)
*H01L 23/522* (2006.01)

(52) U.S. Cl.
CPC ............ *H01L 21/78* (2013.01); *H01L 23/5226* (2013.01)
USPC ........... 438/113; 438/462; 257/724; 257/730; 257/774; 257/777

(58) Field of Classification Search
CPC ... H01L 21/78; H01L 23/544; H01L 23/5226; H01L 25/0657
See application file for complete search history.

(56) References Cited

U.S. PATENT DOCUMENTS

| | | | |
|---|---|---|---|
| 4,130,343 A | 12/1978 | Miller et al. | |
| 4,337,759 A | 7/1982 | Popovich et al. | |
| 4,703,984 A | 11/1987 | Mitchell | |
| 4,979,787 A | 12/1990 | Lichtenberger | |
| 5,073,003 A | 12/1991 | Clark | |
| 5,404,869 A | 4/1995 | Parkyn, Jr. et al. | |
| 5,571,754 A * | 11/1996 | Bertin et al. | ............ 438/109 |
| 5,917,976 A | 6/1999 | Yamaguchi | |
| 6,132,107 A | 10/2000 | Morikawa | |
| 6,456,766 B1 | 9/2002 | Shaw et al. | |
| 6,491,447 B2 | 12/2002 | Aihara | |
| 6,567,574 B1 | 5/2003 | Ma et al. | |
| 6,635,866 B2 | 10/2003 | Chan et al. | |
| 6,697,399 B2 | 2/2004 | Kimura et al. | |
| 6,721,187 B2 | 4/2004 | Hall et al. | |
| 6,741,777 B2 | 5/2004 | Jewell et al. | |

(Continued)

OTHER PUBLICATIONS

U.S. Appl. No. 13/366,326, filed Feb. 5, 2012.

(Continued)

*Primary Examiner* — Alonzo Chambliss
(74) *Attorney, Agent, or Firm* — D. Kligler I.P. Services Ltd.

(57) ABSTRACT

A method for fabricating an optical interconnect includes producing a semiconductor wafer that includes multiple first dies. Each first die includes circuitry disposed over a surface of the wafer and connected to conductive vias arranged in rows. The multiple first dies are diced by cutting the wafer across the rows of the vias, such that, in each first die, the cut vias form respective contact pads on a side face of the first die that is perpendicular to the surface. A second semiconductor die including one or more optoelectronic transducers is attached to the contact pads, so as to connect the transducers to the circuitry.

12 Claims, 6 Drawing Sheets

(56) References Cited

U.S. PATENT DOCUMENTS

| | | | |
|---|---|---|---|
| 6,817,782 | B2 | 11/2004 | Togami et al. |
| 6,841,739 | B2 | 1/2005 | Moore |
| 7,040,814 | B2 | 5/2006 | Morimoto et al. |
| 7,049,704 | B2 | 5/2006 | Chakravorty et al. |
| 7,091,062 | B2 * | 8/2006 | Geyer .................. 438/114 |
| 7,265,719 | B1 | 9/2007 | Moosbrugger et al. |
| 7,267,553 | B2 | 9/2007 | Sone |
| 7,289,701 | B2 | 10/2007 | Lam et al. |
| 7,350,985 | B2 | 4/2008 | Laughlin et al. |
| 7,420,262 | B2 * | 9/2008 | Bauer et al. .................. 257/620 |
| 7,515,415 | B2 | 4/2009 | Monfarad et al. |
| 7,538,358 | B2 | 5/2009 | Badehi et al. |
| 7,665,911 | B2 | 2/2010 | Hamazaki |
| 7,887,243 | B2 | 2/2011 | Abel et al. |
| 8,043,877 | B2 | 10/2011 | Badehi et al. |
| 8,115,302 | B2 | 2/2012 | Andry et al. |
| 8,144,473 | B2 | 3/2012 | Yumoto et al. |
| 8,272,788 | B2 | 9/2012 | Ohta |
| 8,315,287 | B1 | 11/2012 | Roggero et al. |
| 8,723,332 | B2 * | 5/2014 | McElrea et al. ............. 257/777 |
| 2002/0149074 | A1 | 10/2002 | Imaeda |
| 2003/0198439 | A1 | 10/2003 | Hiramatsu |
| 2004/0124523 | A1 * | 7/2004 | Poo et al. ...................... 257/698 |
| 2004/0184727 | A1 | 9/2004 | Liu et al. |
| 2004/0207049 | A1 * | 10/2004 | Bauer et al. .................. 257/620 |
| 2006/0008214 | A1 | 1/2006 | Giboney et al. |
| 2008/0031629 | A1 | 2/2008 | Nguyen et al. |
| 2008/0128864 | A1 * | 6/2008 | Cho .............................. 257/620 |
| 2009/0189258 | A1 * | 7/2009 | Mariani et al. ............... 257/632 |
| 2012/0051685 | A1 | 3/2012 | Su et al. |
| 2012/0224814 | A1 | 9/2012 | Hirano et al. |
| 2013/0136885 | A1 * | 5/2013 | Fujii et al. ...................... 428/68 |
| 2013/0156386 | A1 | 6/2013 | Miller |

OTHER PUBLICATIONS

U.S. Appl. No. 13/369,324 filed, Feb. 9, 2012.
U.S. Appl. No. 13/419,449, filed Mar. 14, 2012.
U.S. Appl. No. 13/481,874, filed May 28, 2012.
U.S. Appl. No. 13/532,829, filed Jun. 26, 2012.
Connected Fibers, LLC., "MT Ferrules", Datasheet, Jan. 2009.
Lee et al., "Silicon Optical Bench for Transmitter Module", Department of Optics and Photonics, National Central University, Taiwan, Oct. 19, 2009.
"Glass and Silicon Packages Webinar", Georgia Institute of Technology, 3D-Systems Packaging Research Center, Atlanta, USA, Jul. 21, 2010.
Micralyne, Inc., "MEMS Optical Components", Apr. 5, 2012.
Eldada et al., "Advances in Polymer Integrated Optics", IEEE Journal of Selected Topics in Quantum Electronics, vol. 5, No. 1, pp. 54-68, Jan./Feb. 2000.
International Electrotechnical Commision, "Fiber Optic Connector Interfaces—Part 5: Type MT Connector Family", IEC document No. IEC61754-5, second edition, 32 pages, Jul. 2005.
U.S. Appl. No. 13/532,829 Office Action dated Oct. 4, 2013.
U.S. Appl. No. 13/366,326 Office Action dated Oct. 25, 2013.
Lagziel et al., U.S. Appl. No. 13/851,178, filed Mar. 27, 2012.
Levy et al., U.S. Appl. No. 13/677,374, filed Nov. 15, 2012.
Levy et al., U.S. Appl. No. 13/731,025, filed Dec. 30, 2012.
Stockham et al., "Assembly of micro-optical systems with mechanical positioning", Proceedings of the SPIE, Optomechatronic Micro/Nano Devices and Components II, 637609, Oct. 13, 2006.
U.S. Appl. No. 13/369,324 Office Action dated Nov. 4, 2013.
U.S. Appl. No. 13/366,326 Office Action dated Mar. 27, 2014.
U.S. Appl. No. 13/731,025 Office Action dated Mar. 20, 2014.
U.S. Appl. No. 13/677,374 Office Action dated Jan. 30, 2014.
U.S. Appl. No. 13/851,178 Office Action dated Aug. 29, 2014.

* cited by examiner

METHOD OF FABRICATING INTEGRATED OPTOELECTRONIC INTERCONNECTS WITH SIDE MOUNTED TRANSDUCER

CROSS-REFERENCE TO RELATED APPLICATIONS

This application is related to a U.S. patent application entitled "Optoelectronic Interconnects Using L-shaped Fixture," Ser. No. 13/419,449, filed on even date, whose disclosure is incorporated herein by reference.

FIELD OF THE INVENTION

The present invention relates generally to optical communication, and particularly to integrated optical interconnects.

BACKGROUND OF THE INVENTION

Optoelectronic interconnects typically integrate a control chip with optoelectronic transducers, such as semiconductor lasers and photodiodes, which are utilized, for example, in high data rate, high bandwidth communication systems. Typically, optoelectronic interconnects are used in optical modules, which are fabricated using a variety of hybrid assembly techniques, and sometimes require high precision alignment processes when directing light between the optical fiber core to the optoelectronic transducer.

SUMMARY OF THE INVENTION

An embodiment that is described herein provides a method for fabricating an optical interconnect. The method includes producing a semiconductor wafer that includes multiple first dies. Each first die includes circuitry disposed over a surface of the wafer and connected to conductive vias arranged in rows. The multiple first dies are diced by cutting the wafer across the rows of the vias, such that, in each first die, the cut vias form respective contact pads on a side face of the first die that is perpendicular to the surface. A second semiconductor die including one or more optoelectronic transducers is attached to the contact pads, so as to connect the transducers to the circuitry.

In some embodiments, producing the wafer includes forming the conductive vias in side-contact rings that surround the first dies, and dicing the first dies includes exposing cross-sections of the vias along the side face of each first die. In other embodiments, the method includes disposing a gold metal layer over the contact pads. In yet other embodiments, the conductive vias include gold-filled through-silicon vias (TSV).

In some embodiments, attaching the second semiconductor die includes disposing ball bumps onto the contact pads and melting the ball bumps. In other embodiments, the method includes forming integrated respective lenses opposite the optoelectronic transducers.

There is additionally provided, in accordance with an embodiment of the present invention, an apparatus including first and second semiconductor dies. The first semiconductor die includes circuitry connected to conductive vias arranged in rows disposed over a surface of a semiconductor wafer, and is cut from the wafer across a row of the vias such that the cut vias form respective contact pads on a side face of the first die that is perpendicular to a surface of the first die. The second semiconductor die includes one or more optoelectronic transducers and is attached onto the contact pads so as to connect the transducers to the circuitry.

The present invention will be more fully understood from the following detailed description of the embodiments thereof, taken together with the drawings in which:

DETAILED DESCRIPTION OF EMBODIMENTS

Overview

Network communication systems, such as Infiniband, can comprise optoelectronic-based connectivity or switching components, such Enhanced Data Rate (EDR) active optical cables, EDR optical module switches, and EDR Host Channel Adapter (HCA) optical modules. These optical components comprise optical engines, which are often regarded as the lowest hierarchical optical building blocks, comprising an optical fiber array which is interfaced to an optoelectronic transducer array.

Optoelectronic transducers may comprise, for example, lasers to generate light and photodetectors to detect light, which is routed in optical fibers between the elements of the communication system. Optical modules may also comprise optoelectronic interconnects which couple the control and processing signals from one integrated circuit chip to another chip comprising the optoelectronic transducers.

Embodiments of the present invention that are described herein provide improved methods for fabricating optoelectronic interconnects and optical engines. In some embodiments, a semiconductor die comprises an array of optoelectronic transducers such as Vertical Cavity Surface Emitting Lasers (VCSEL) and/or photodetectors (PD). Another semiconductor die comprises ancillary circuitry such as transimpedance amplifiers (TIA) and/or laser drivers.

The die comprising the optoelectronic transducers is connected to the die comprising the ancillary circuitry using a novel interconnection mechanism: An edge of the ancillary circuitry die comprises a row of vertical metal-filled conductive via holes ("vias"), whose vertical cross sections become exposed when the die is diced from a semiconductor wafer. The exposed vias form contact pads along the die edge. The die comprising the optoelectronic transducers is connected (e.g., bonded) to these contact pads.

This interconnection approach reduces the overall interconnect length between the ancillary circuitry and the optoelectronic transducers, and therefore increases performance and bandwidth. Interconnection of this sort also reduces component count, and simplifies both the optical and mechanical configurations of the optical interconnect, thus reducing cost.

In other disclosed embodiments, a die comprising an array of optoelectronic transducers is attached to a vertical face of an L-shaped fixture. A die comprising ancillary circuitry is mounted parallel to the horizontal face of the L-shaped fixture. The L-shaped fixture comprises electrical interconnects coupling the ancillary circuitry on one die to the optoelectronic transducers on the other die. This approach significantly reduces the interconnect length between the ancillary circuitry and the optoelectronic transducers, thus significantly improving performance and bandwidth. The L-shaped fixture also provides a simple and direct coupling of optical fibers to the optoelectronic transducers on the other die.

Optoelectronic Interconnect Fabrication

Figure 1A:
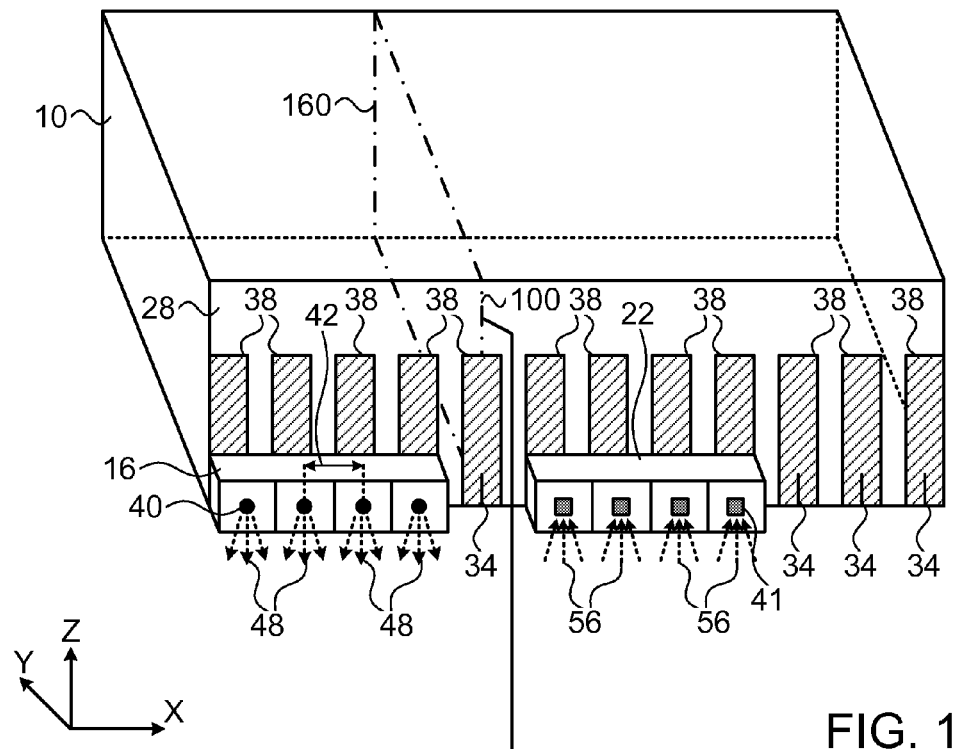
FIGS. 1A and 1B are an isometric view and cross-sectional view of an optoelectronic interconnect, respectively, in accordance with an embodiment of the present invention.
Figure 1B:
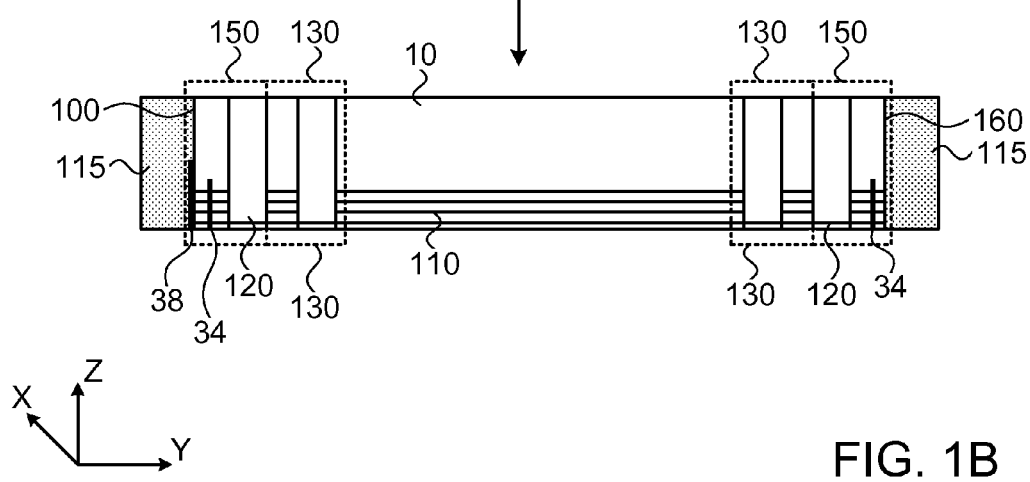

FIGS. 1A and 1B are an isometric view and a cross-sectional view, respectively, of a optoelectronic interconnect, in accordance with an embodiment of the present invention. The optical interconnect is fabricated on a semiconductor die, in the present example a silicon complementary metal oxide semiconductor (CMOS) logic chip 10. A VCSEL chip 16 and a photodetector (PD) chip 22 are bonded to a side wall edge 28 of chip 10. Chip 10 comprises ancillary circuitry (not shown in the figure) such as integrated drivers that drive VCSELs 40 with electrical signals, TIAs that amplify electrical signals produced by PDs 41, and/or any other suitable circuitry. Chip 10 has a typical dimension of 20 mm×20 mm with a thickness of 500-700 μm and is oriented as shown relative to the Cartesian coordinate axes (X,Y,Z).

In a typical manufacturing process, multiple dies such as chip 10 are diced from a semiconductor wafer. The internal metallization of chip 10 was configured whereupon dicing the wafer exposes an array of conductive contact vias 34 on the X-Z side wall 28 as shown in FIG. 1A as will be described later. Gold contact pads 38 are then formed on exposed vias 34. VCSEL chip 16 and PD chip 22 are bonded onto contact pads 38.

The VCSEL and PD chips shown in FIG. 1A each comprise four individual VCSEL devices 40 and four individual PD devices 41, respectively, purely for conceptual clarity and not by limitation of the embodiments of the present invention. Both VCSEL chip 16 and PD chip 22 have a device-to-device pitch 42 of about 250 μm. From VCSEL chip 16, light rays 48 exit the chip as shown in FIG. 1A perpendicular to the X-Z plane. Similarly, light rays 56 enter photodiode chip 22 are shown in FIG. 1A perpendicular to the X-Z plane.

The optical interconnect configuration of FIG. 1 is an example configuration that is chosen purely for the sake of conceptual clarity. In alternative embodiments, any other suitable configuration can be used. For example, in the present example chip 10 comprises a silicon chip and chips 16 and 22 comprise Gallium Arsenide (GaAs) chips. Alternatively, chips 10, 16 and 22 may be fabricated using any other suitable substrate material. In the present example, the VCSEL array and PD array are fabricated in separate chips. Alternatively, VCSELs and PDs may be intermixed in the same chip. Any desired number of chips carrying optoelectronic transducers can be attached to chip 10 in the disclosed manner. The VCSELs and PDs are examples of optoelectronic transducers. In alternative embodiments, any other suitable transducer types can be used.

FIG. 1B is a cross-sectional cut of silicon chip 10 (shown as the region bounded by the dotted lines in FIG. 1A) along a front line 100 on the Y-Z plane to a back line 160 on the Y-Z plane according to the Cartesian coordinate axes shown. The semiconductor process used to fabricate the CMOS chips was intentionally reconfigured to allow for a line of vias 34 to be exposed along the edge 28 of die 10 after dicing.

In a conventional CMOS process, a multilevel stack 110 of metal layers is shown in FIG. 1B. Approaching the sides of the intended die fabricated in the wafer prior to dicing, saw rings 115 are placed around the die region where the saw blade cuts the wafer. Saw ring 115 region shown in FIG. 1B defines the region where the saw blade cuts the chip during the dicing process and typically does not exist on the final die.

The die from a conventional CMOS process would normally terminate with a sealing ring 130 region in which no vertical vias are permitted. However, to accommodate the formation of the exposed side vias, in accordance with the embodiments of the present invention, the CMOS process was reconfigured to add a via side contact ring 150 adjacent to saw ring 115. The via side contact ring comprises a region in which no metallization is permitted except for one metal feedthrough layer 120 that enables contact between inner metal stack 115 and via 34 within via side contact ring 150. In this manner, when the die is cut from the wafer along saw ring 115 by a saw, laser etching, or other appropriate cutting procedure, along face 28, an array of vias 34 is exposed on face 28. In some embodiments, a gold metal layer is disposed onto vias 34 by methods such as gold deposition or gold plating to form gold metal pads 38.

In other embodiments, vias 34 comprise gold-filled through-silicon vias (TSV), which are utilized in the process and oriented as the vias 34 shown in FIG. 1B. The gold filled TSV structures traverse die 10 completely from top to bottom side of the wafer (not shown in FIG. 1A or FIG. 1B). However, upon dicing the wafer along the array of gold filled TSV structures on face 28, the exposed contacts require no additional disposition of a gold layer to form the gold contact pads. Further alternatively, vias 34 may be fabricated using any other suitable structure or process.

VCSEL chip 16 and PD chip 22 can be attached to Si chip 10 by a number of methods. In some embodiments, chips 16 and 22 are attached to chip 10 using a flip-chip process. In an example of such a process, transducers 40 and 41 are located on the side of chips 16 and 22 in contact with face 28. Chips 16 and 22 comprise backside openings, e.g., thinned regions in the GaAs around each optoelectronic transducer (not shown in FIG. 1A), which are configured to provide a more efficient back illumination of the transducers perpendicular to the X-Z plane. The flip chip attachment process uses ball bumps comprising gold-based alloys that are first attached either to the optoelectronic transducer chip contacts or to Si pads 38. Heating is then used to melt the ball bumps and to attach the optoelectronic transducer chip to the Si both electrically and mechanically. The gold bumps also absorb differences in the temperature expansion coefficients between the Si chip and the GaAs optoelectronic transducer chips during fabrication or normal operation of the device.

In other embodiments, VCSEL chip 16 and PD chip 22 can be bonded to Si chip 10 by conducting glues or pastes. The methods for attaching the optoelectronic transducer chips to the side wall of the Si chip described above are for conceptual clarity and not by way of limitation of the embodiments of the present invention. Any appropriate method for attaching the optoelectronic transducer chips to the side wall of the Si chip can be utilized.

Figure 2:
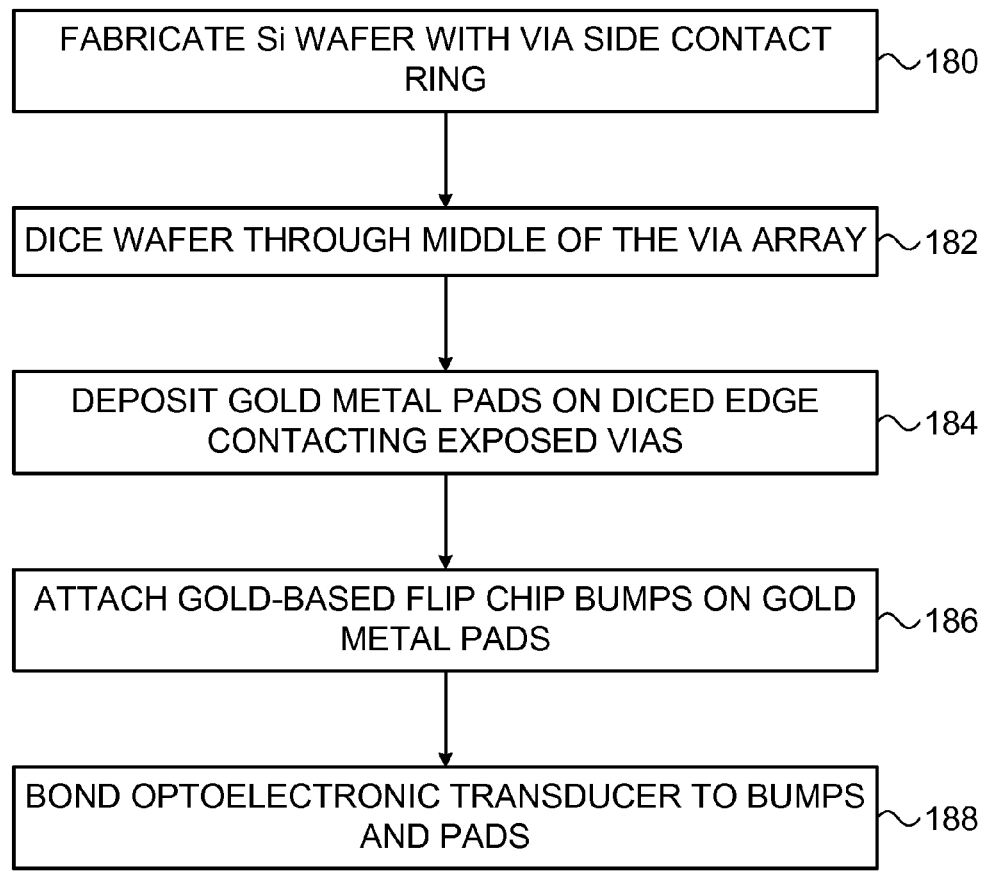
FIG. 2 is a flow chart that schematically illustrates a method for forming an optoelectronic interconnect, in accordance with an embodiment of the present invention.

In some embodiments of the present invention, the VCSEL array and/or PD array can comprise an integrated lens array to couple light rays into 48 or couple light rays 56 out of the die and into fibers that are coupled to these devices (not shown in FIG. 1A). In other embodiments, any appropriate configuration of optical interconnects can be formed which directly couples light between optical fibers and the side-mounted optoelectronic transducers. Yet in other embodiments, the top surface of the silicon die can be connected mechanically to a heat sink. FIG. 2 is a flow chart that schematically illustrates a method for forming the optoelectronic interconnect described above, in accordance with an embodiment of the present invention. In a wafer fabrication step 180, the Si wafer is fabricated with via side contact rings 150. In a dicing step 182, the wafer is diced along saw ring 115 and through the middle of the array of vias 34 on face 28. In a deposition step 184, gold metal pads 38 are deposited onto the exposed vias 34 along diced edge face 28 of chip 10. In an attachment step 186, gold based flip chip bumps are attached to the gold metal pads 38. In a bonding step 188, the VCSEL die 16 and/or PD die 22 are bonded to the bumps and gold metal pads 38.

L-Shaped Optical Engine Fabrication

Figure 3:
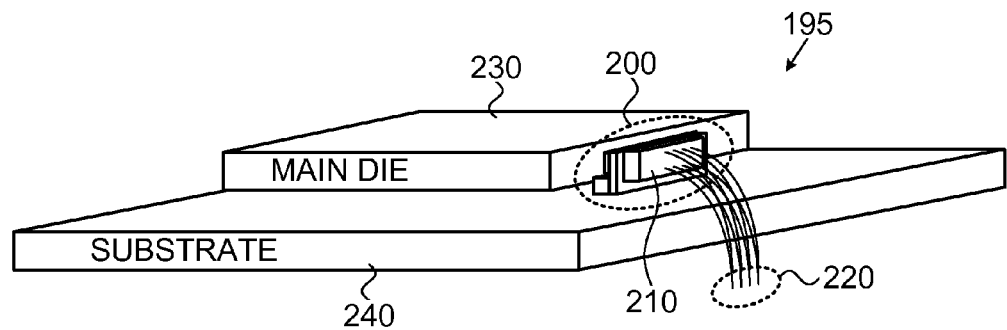
FIG. 3 shows an isometric view of an optical circuit assembly, in accordance with an embodiment of the present invention.

FIG. 3 shows an isometric view of an optical circuit assembly 195, in accordance with an embodiment of the present invention. Optical Circuit assembly 195 comprises an L-shaped optical engine 200 on which a ferrule 210 is mechanically mounted. The ferrule is mounted on one face of the vertical face of the L-shaped carrier, and directs light between optical fibers 220 from an optical ribbon and optoelectronic transducers that are mounted on the opposite side of the vertical face of the optical engine. (The structure of engine 200 is shown in detail in FIGS. 4A, 4B, 5A and 5B below.)

A main semiconductor die 230 is mounted parallel to the second face of L-shaped engine 200. The design of optical circuit assembly 195 shown in the embodiments presented herein significantly reduces the interconnect length between ancillary circuits on main die 230 (typically Si CMOS components, not shown in the figure) and the optoelectronic transducers (typically GaAs) that will be described later. Main die 230 in the present example has a dimension of 20 mm by 20 mm. The ancillary circuits may comprise, for example, TIA and/or driver circuits for the optoelectronic transducers (i.e. VCSEL or photodiodes), or any other suitable transducer type.

Figure 4A:
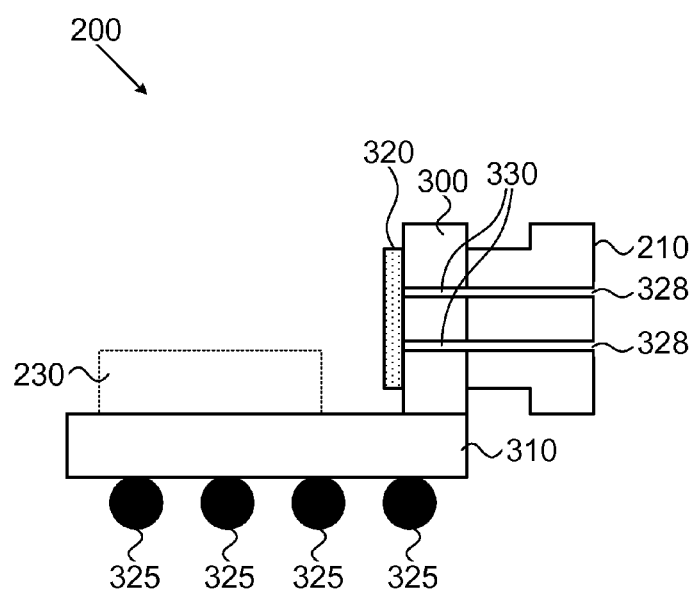
FIGS. 4A and 4B show a side view and a back-side view of an optical engine, respectively, in accordance with an embodiment of the present invention.
Figure 4B:
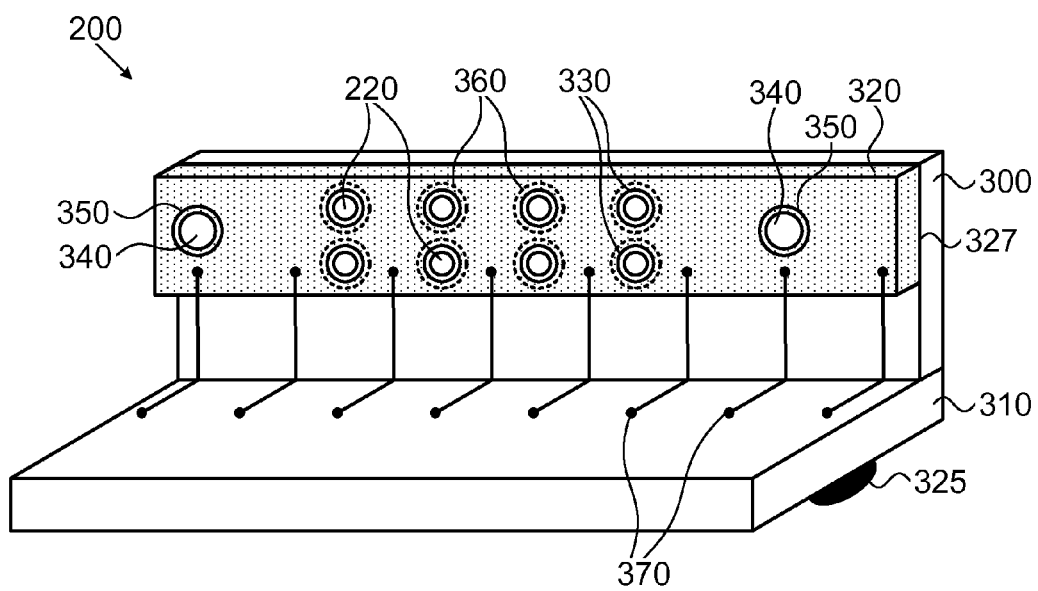

Main die 230 and optical engine 200 comprising ferrule 210 and fibers 220 are mounted onto a substrate 240. In the present implementation, up to six optical engines 200 can be mounted on substrate 240 to interface with one main die 230. With this approach, the distance from optical engine 200 to main die 230 as mounted on substrate 240 is about 100 μm and ensures short interconnect lengths. Substrate 240 may comprise an appropriate printed circuit board material, a large Silicon die, or any other appropriate material. The dimensions given above are chosen by way of example, and any other suitable dimensions can be used in alternative embodiments, FIGS. 4A and 4B show a side view and a back-side view of optical engine 200, respectively, in accordance with an embodiment of the present invention. Optical engine 200 comprises an L-shaped fixture comprising a vertical carrier plate 300 and a base carrier plate 310 as shown in FIG. 4A.

The vertical and base carrier plates may each be formed from a two-sided printed circuit board, a silicon die, thin plastic, or any other appropriate material. Vertical carrier plate 300 comprises holes that are etched or drilled through the material. The holes are configured to allow both ferrule 210 to be mounted on one side of vertical carrier plate 300, and a GaAs die 320 comprising optoelectronic transducers, to be mounted on the opposite side. Solder bumps 325 provide support for mounting the optical engine onto corresponding bond pads on the surface of substrate 240, and allow for electrical connections in the optical engine between the ancillary circuits in main die 230 and GaAs chip 320 through interconnects in substrate 240.

Ferrule 210 has small microtunnels 328 drilled into the body of the ferrule, which allow for thin optical fibers 220 from an optical fiber ribbon (not shown in FIG. 4A) to be inserted into the microtunnels and mechanically supported by the ferrule. Ferrule microtunnels 328 also align fibers 220 with fiber holes 330 in vertical carrier plate 300. Once the fibers from the fiber ribbon are inserted and bonded into the microtunnels, the ferrule can be bonded to the vertical carrier plate by gluing or by spring attachment, for example. Examples of ferrules are MT Ferrules produced by Connected Fibers, Inc. (Roswell, Ga.). A datasheet entitled "MT ferrules," January, 2009, is incorporated herein by reference.

In some embodiments, vertical carrier plate 300 and base carrier plate 310 may be formed from the same flexible printed circuit board that is mechanically folded directly into the L-shaped fixture. In other embodiments as shown in FIG. 4A, main die 230 may be attached directly to the base carrier plate 310, which is configured to be large enough to support the main die, and wherein interconnect routing within the fixture is configured to provide an electrical connection to interconnect routing within substrate 240. In some embodiments, main die 230 is not mounted on base carrier plate 230, but mounted directly to substrate 240 as shown in FIG. 3.

FIG. 4B shows a back-side view of optical engine 200, in accordance with an embodiment of the present invention. Optoelectronic transducer chip 320 is attached to vertical carrier plate 300 of the L-shaped fixture. Vertical carrier plate 300 comprises a number of holes which are chemically etched or mechanically drilled through vertical carrier plate 300. The holes through vertical carrier plate 300 are shown in FIG. 4B for conceptual clarity as superimposed onto optoelectronic transducer chip 320, but these holes terminate at an interface 327 between the attached chip 320 to vertical carrier plate 300.

Fiber holes 330 hold the ends of optical fibers 220 extending from the ferrule assembly mounted on the side opposite to chip 320 (not shown in this figure). Holes 330 are configured to align the cleaved fiber ends at interface 327 with optoelectronic transducers 360 (shown as the dotted circles in FIG. 4B) on chip 320. L-shaped optical engine 200 also comprises ferrule guide pin holes 350 which mechanically support guide pins 340 attached to the ferrule housing 210 (not shown in FIG. 4B) and terminate at interface 327, which will be described later.

The base and vertical carrier plates comprise interconnect traces 370, e.g., double-sided printed circuit board and flip chip pads (not shown). Traces 370 route the electrical signals between the base and vertical carrier plates. The optoelectronic transducers 360 on chip 320 are configured in this example in a two-dimensional (2-D) array in order to increase the input/output (I/O) density from chip 320 to main die 230.

In some embodiments, thin interconnect traces 370 have a width of 200 μm to connect the chip 320 to the ancillary circuitry on main die 230. In other embodiments, traces 370 may comprise microbumps on the base carrier plate to allow for the main die to be mounted directly onto base carrier plate 310 as shown in FIG. 4A. Yet in other embodiments, chip 320 is connected to main die 230 via traces 370 and bumps 325 on the bottom side of the base plate, and into interconnects on substrate 240 configured to route into the main die.

Figure 5A:
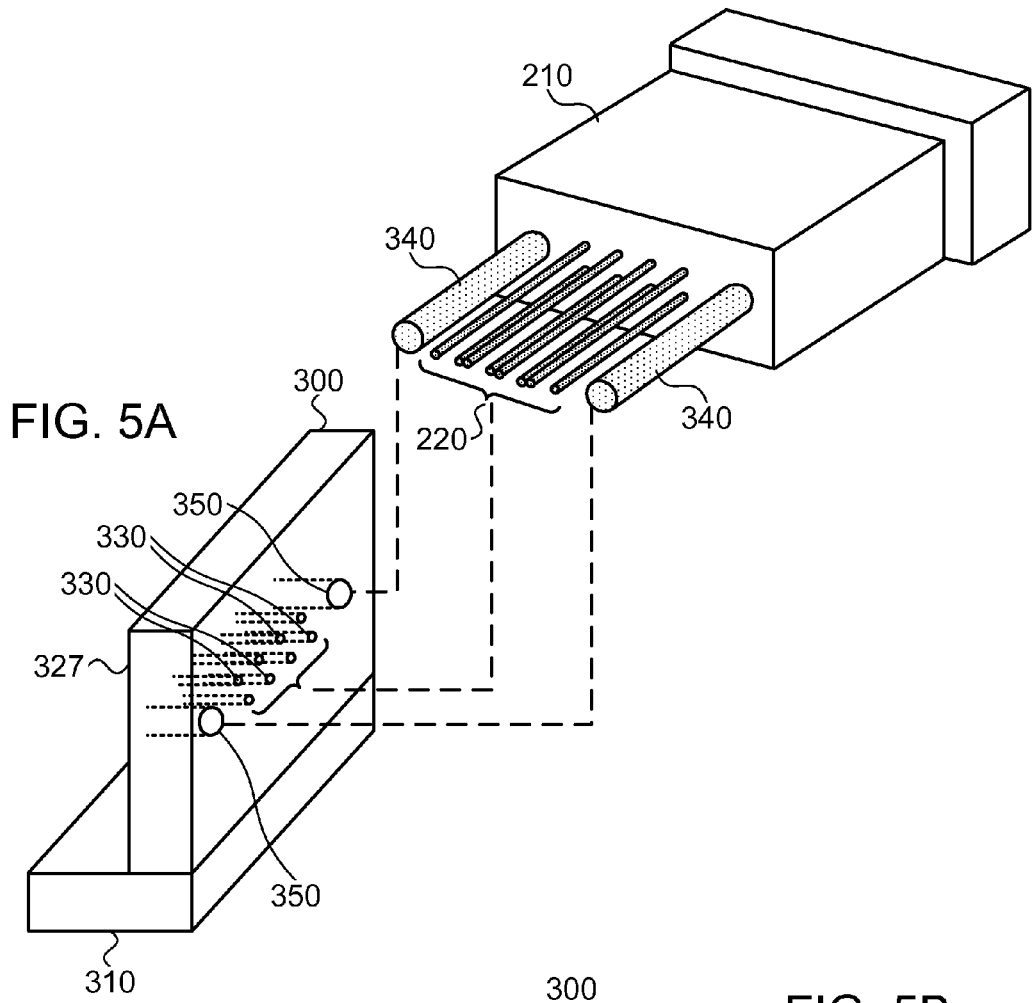
FIGS. 5A and 5B are isometric views illustrating the structure of an optical engine, in accordance with an embodiment of the present invention.
Figure 5B:
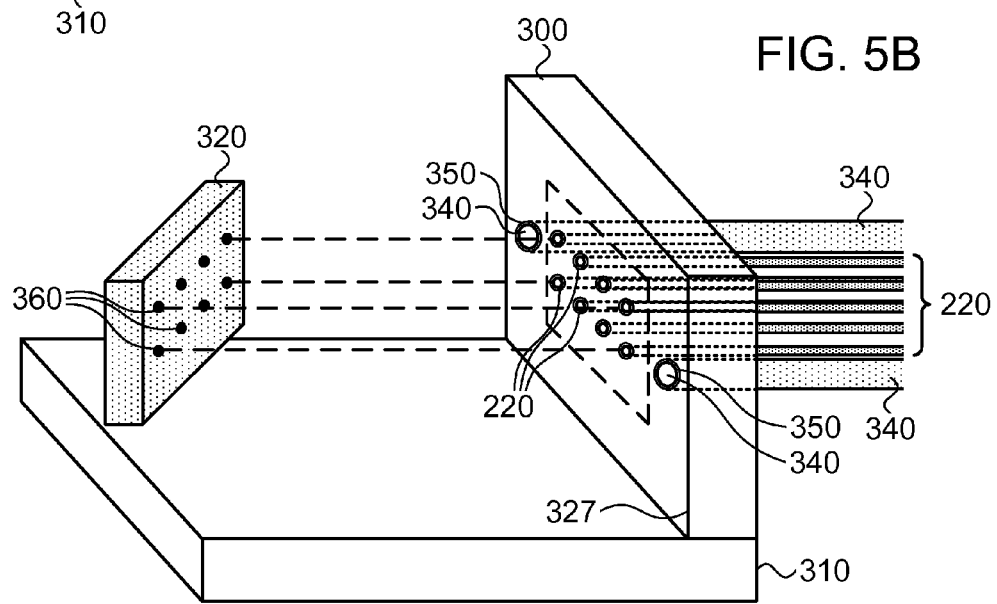

FIGS. 5A and 5B are isometric views illustrating the structure of the optical engine, in accordance with an embodiment of the present invention. FIG. 5A shows a right-sided isometric view of the unassembled L-shaped optical engine comprising holes that are formed through vertical carrier plate 300, which is attached to the base carrier plate 310. Ferrule 210 comprises eight fibers 220 from a fiber ribbon (not shown), which are fed through eight holes in the ferrule, and inserted into fiber holes 330 in vertical carrier plate 300.

Ferrule 210 also comprises guide pins 340, which are fed through guide pin holes 350, and provide mechanical support for the ferrule within vertical carrier plate 300 after attachment. The length of the fibers 220 and guide pins 340 extending from the ferrule housing are configured so as not to extend past edge 327 after insertion and mounting into vertical carrier plate 300. The configuration of FIG. 5A is shown purely for conceptual clarity and not by way of limitation whatsoever of the embodiments of the present invention. In alternative embodiments, any other suitable configuration can be used.

FIG. 5B shows a left-sided isometric view of the unassembled L-shaped optical engine. Since the placement of fibers 220 and guide pins 340 do not extend past edge 327, the 2-D pitch of optoelectronic transducers 360 on chip 320 are configured to self-align transducers 360 precisely with the cleaved edge of fibers 220 in fiber holes 330 after the attachment of chip 320.

The height of the vertical carrier plate is determined by the array size of the optoelectronic transducers on chip 320. Chip 320 comprising a row of VCSEL devices above a row of photodetector devices has a height of 500 µm. In VCSEL/PD array of 12 devices (not shown), the length of the chip is about 3200 µm. For the VCSEL/PD array comprising four devices shown in FIG. 5B, the length of the chip is about 1200 µm. Typically, the vertical carrier plate thickness is about 0.1 mm.

This configuration allows for self-aligned coupling of light between the optoelectronic transducers and the fibers fed through the microtunnels of the ferrule mounted on vertical carrier plate 300. The dimensions above are given purely by way of example, and any other suitable dimensions can be used in alternative embodiments.

In some embodiments, the optoelectronic transducers comprise respective integrated lenses formed in the GaAs chip 320. In other embodiments, optical fibers 220 comprise lenses that are formed on the edge of each fiber prior to insertion and assembly within the ferrule and vertical carrier plates. In some embodiments, lenses are integrated into fiber holes 330 and embedded within the vertical carrier plate. In other embodiments, the height of the vertical carrier plate can be configured to allow mounting for both the optoelectronic transducer die and the main die on the vertical carrier plate e.g., the same face.

The mechanical configuration shown in FIGS. 4A, 4B, 5A and 5B is an example configuration that is shown purely for the sake of conceptual clarity. In alternative embodiments, any other configuration, in which a transducer die is mounted on one face of an L-shaped fixture and an ancillary circuitry die is mounted parallel to the other face of the fixture, can be used.

Figure 6:
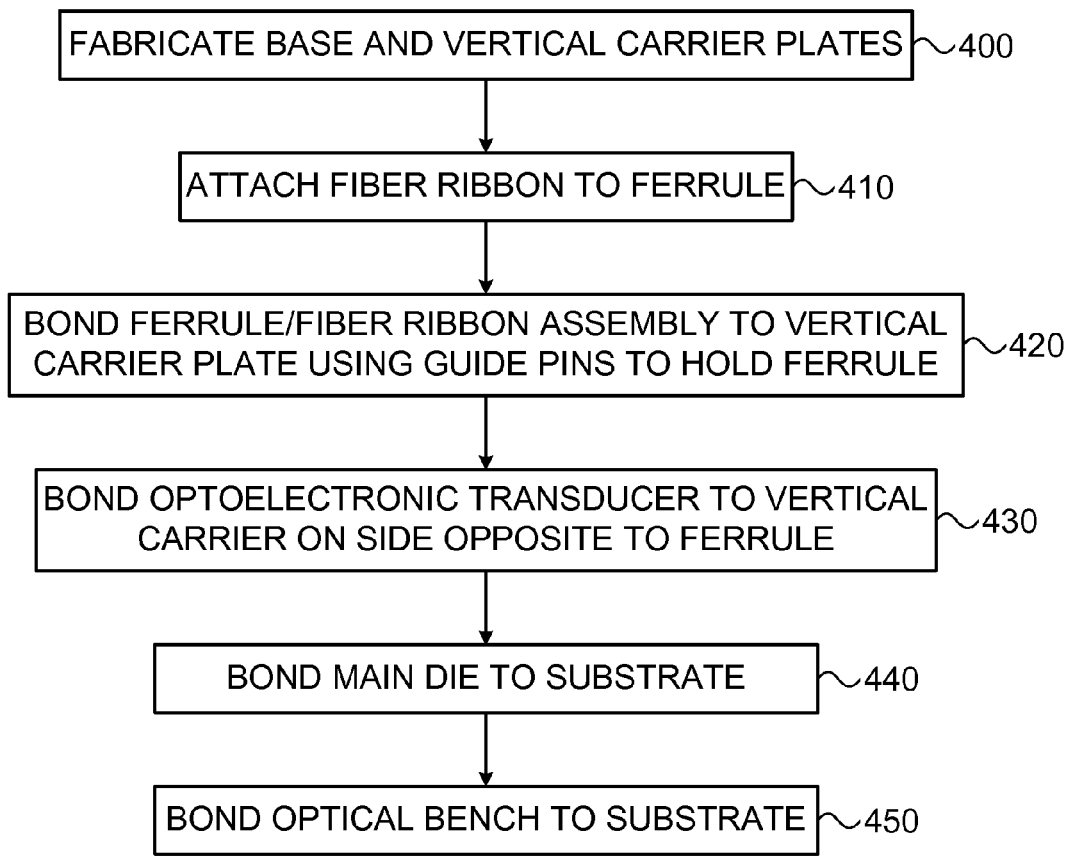
FIG. 6 is a flow chart that schematically illustrates a method for fabricating an optical engine, in accordance with an embodiment of the present invention.

FIG. 6 is a flow chart that schematically illustrates a method for fabricating the optical engine, in accordance with an embodiment of the present invention. In a fabrication step 400, base carrier plate 310 and vertical carrier plate 300 are fabricated, which are utilized to form optical engine 200. In an attachment step 410, the fiber ribbon is attached to ferrule 210 wherein fibers 220 are fed through and mounted in microtunnels 328 preformed in the housing of the ferrule. In a bonding step 420, ferrule 210 and fibers 220 from the fiber ribbon are bonded to vertical carrier plate 300 using guide pins 340 to hold the ferrule in place.

In a first bonding step 430, optoelectronic transducer chip 320 is bonded to vertical carrier plate 300 on the side opposite to ferrule 210 completing the assembly of optical engine 200. In a second bonding step 440, main die 230 is bonded to substrate 240. In a third bonding step 450, optical engine 200 is then bonded to substrate 240 to complete optical circuit assembly 195.

Although the embodiments described herein mainly relate to the fabrication of optoelectronic interconnects and optical engines, the methods described herein can also be used in other applications, wherein integrated optoelectronic interconnects or integrated optical engines comprising self-aligned fibers with optoelectronic transducer chips are required for different optical system applications.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for fabricating an optical interconnect, the method comprising:
    producing a semiconductor wafer comprising multiple first dies, each first die comprising circuitry disposed over a surface of the wafer and connected to conductive vias arranged in rows;
    dicing the multiple first dies by cutting the wafer across the rows of the vias, such that, in each first die, the cut vias form respective contact pads on a side face of the first die that is perpendicular to the surface; and
    attaching to the contact pads a second semiconductor die comprising one or more optoelectronic transducers, so as to connect the transducers to the circuitry.

2. The method according to claim 1, wherein producing the wafer comprises forming the conductive vias in side-contact rings that surround the first dies, and wherein dicing the first dies comprises exposing cross-sections of the vias along the side face of each first die.

3. The method according to claim 1, and comprising disposing a gold metal layer over the contact pads.

4. The method according to claim 1, wherein the conductive vias comprise gold-filled through-silicon vias (TSV).

5. The method according to claim 1, wherein attaching the second semiconductor die comprises disposing ball bumps onto the contact pads and melting the ball bumps.

6. The method according to claim 1, and comprising forming integrated respective lenses opposite the optoelectronic transducers.

7. An apparatus, comprising:
    a first semiconductor die, which comprises circuitry connected to conductive vias arranged in rows disposed over a surface of a semiconductor wafer and is cut from the wafer across a row of the vias such that the cut vias form respective contact pads on a side face of the first die that is perpendicular to a surface of the first die; and a second semiconductor die, which comprises one or more optoelectronic transducers and is attached onto the contact pads so as to connect the transducers to the circuitry.

8. The apparatus according to claim 7, wherein the conductive vias are located in a side-contact ring, which surrounds the first die before the first die is cut from the wafer, such that cross-sections of the vias are exposed along the side face of the first die when the first die is cut from the wafer.

9. The apparatus according to claim 7, and comprising a gold metal layer that is disposed over the contact pads.

10. The apparatus according to claim 7, wherein the conductive vias comprise gold-filled through-silicon vias (TSV).

11. The apparatus according to claim 7, wherein the second semiconductor die is attached to the first die using ball bumps that are placed onto the contact pads and melted.

12. The apparatus according to claim 7, and comprising respective integrated lenses that are formed opposite the optoelectronic transducers.

* * * * *